(12) United States Patent
Choi et al.

(10) Patent No.: US 10,739,659 B2
(45) Date of Patent: Aug. 11, 2020

(54) DISPLAY DEVICE

(71) Applicant: Samsung Display Co., LTD., Yongin-si, Gyeonggi-Do (KR)

(72) Inventors: Chaun-Gi Choi, Suwon-si (KR); Jeong-Woo Moon, Suwon-si (KR)

(73) Assignee: Samsung Display Co., Ltd (KR)

( * ) Notice: Subject to any disclaimer, the term of this patent is extended or adjusted under 35 U.S.C. 154(b) by 90 days.

(21) Appl. No.: 15/706,473

(22) Filed: Sep. 15, 2017

(65) Prior Publication Data

US 2018/0081249 A1    Mar. 22, 2018

(30) Foreign Application Priority Data

Sep. 22, 2016   (KR) .................. 10-2016-0121746

(51) Int. Cl.
| | | |
|---|---|---|
| *G02F 1/155* | (2006.01) | |
| *G02F 1/1335* | (2006.01) | |
| *G02F 1/157* | (2006.01) | |
| *G02F 1/163* | (2006.01) | |
| *H01L 27/32* | (2006.01) | |

(52) U.S. Cl.
CPC ........ *G02F 1/155* (2013.01); *G02F 1/133509* (2013.01); *G02F 1/133553* (2013.01); *G02F 1/157* (2013.01); *G02F 1/163* (2013.01); *H01L 27/3232* (2013.01); *G02F 2001/1552* (2013.01); *G02F 2201/44* (2013.01); *H01L 27/3244* (2013.01)

(58) Field of Classification Search
CPC .......... G02F 1/155; G02F 1/157; G02F 1/161; G02F 1/133509; G02F 1/133553; G02F 1/133555; G02F 1/163; G02F 2201/44; G02F 2001/1552; G02F 2001/1555; H01L 27/3232; H01L 27/3227; H01L 27/3244
USPC .................................................. 359/267–274
See application file for complete search history.

(56) References Cited

U.S. PATENT DOCUMENTS

| | | | | |
|---|---|---|---|---|
| 6,356,376 | B1 * | 3/2002 | Tonar | .................. B60Q 1/2665 359/267 |
| 6,700,692 | B2 | 3/2004 | Tonar et al. | |
| 2005/0248824 | A1 * | 11/2005 | Fukazawa | ............. G02F 1/1523 359/265 |
| 2006/0050356 | A1 * | 3/2006 | Varaprasad | ............... B60R 1/12 359/265 |
| 2006/0285190 | A1 * | 12/2006 | Agrawal | ................ B60R 1/088 359/265 |
| 2011/0163664 | A1 * | 7/2011 | Kang | ................... H01L 27/3232 313/504 |

(Continued)

FOREIGN PATENT DOCUMENTS

| | | |
|---|---|---|
| KR | 10-0932936 B1 | 12/2009 |
| KR | 10-2013-0112693 A | 10/2013 |

*Primary Examiner* — Marin Pichler
(74) *Attorney, Agent, or Firm* — Innovation Counsel LLP

(57) ABSTRACT

A display device may include a first substrate, an encapsulation substrate overlapping the substrate, a display unit disposed between the first substrate and the encapsulation substrate, a first electrode disposed between the display unit and the encapsulation substrate and having a first reflectance, a second electrode overlapping the first electrode and having a second reflectance greater than the first reflectance, and an electrochromic unit disposed between the first electrode and the second electrode.

20 Claims, 4 Drawing Sheets

(56) References Cited

U.S. PATENT DOCUMENTS

2011/0267673 A1* 11/2011 Agrawal ............... G02F 1/155
                                                    359/267
2014/0299850 A1* 10/2014 Yim ..................... H01L 33/60
                                                    257/40

* cited by examiner

DISPLAY DEVICE

CROSS-REFERENCE TO RELATED APPLICATION(S)

This application claims priority under 35 USC § 119 to Korean Patent Application No. 10-2016-0121746, filed on Sep. 22, 2016 in the Korean Intellectual Property Office (KIPO); the entire disclosure of the Korean Patent Application is incorporated by reference herein.

BACKGROUND

1. Field

The technical field is related to display devices.

2. Description of the Related Art

Display devices may be required in various types of electronic devices. Modern display devices may include liquid crystal display devices, electrophoretic display devices, organic light emitting display devices, field emission display devices, plasma display devices, etc. In various applications, thinness of display devices may be desirable.

SUMMARY

Embodiments may be related to a display device with a minimized volume/thickness, a mirror function, and/or a light transmittance control function.

A display device according to embodiments may include the following elements: a substrate; a display unit disposed on the substrate; an encapsulation substrate facing the substrate; and a reflective unit disposed on the encapsulation substrate to face the display unit. The reflective unit may include a first electrode disposed on the encapsulation substrate, the first electrode having a first reflectance; a second electrode facing the first electrode, the second electrode having a second reflectance greater than the first reflectance; and an electrochromic unit disposed between the first electrode and the second electrode, the electrochromic unit having light transmittance changed/controlled based on an electric field formed between the first electrode and the second electrode.

In an embodiment, the first electrode may include a transparent conductive oxide.

In an embodiment, the second electrode may include a metal.

In an embodiment, a thickness of the second electrode may be in a range between about 40 angstrom (Å) and about 500 Å.

In an embodiment, the first electrode may transmit external light incident through the encapsulation substrate. The second electrode may reflect some rays of the external light and, may transmit other rays of the external light.

In an embodiment, the reflective unit may further include a transparent protective electrode disposed on the second electrode. The transparent protective electrode may be disposed on one surface or opposite surfaces of the second electrode.

In an embodiment, the transparent protective electrode may include a transparent conductive oxide.

In an embodiment, a thickness of the transparent conductive oxide may be in a range between about 10 Å and about 1000 Å.

In an embodiment, the electrochromic unit may include an electrochromic material and an electrolyte.

In an embodiment, the electrochromic unit may include an electrolyte layer and an electrochromic layer disposed on one surface or opposite surfaces of the electrolyte layer.

In an embodiment, the display device may further include a sealing unit disposed between the substrate and the encapsulation substrate to attach the encapsulation substrate to the substrate, the sealing unit being spaced apart from the display unit and the reflective unit.

In an embodiment, the reflective unit may include a first pad disposed between the sealing unit and the encapsulation substrate, the first pad electrically connected to the first electrode; and a second pad disposed between the sealing unit and the encapsulation substrate and spaced apart from the first pad, the second pad electrically connected to the second electrode.

In an embodiment, the first pad and the second pad may include substantially the same material with the first electrode.

In an embodiment, the first pad and the second pad may include a transparent conductive oxide.

In an embodiment, the first pad may include substantially the same material as the first electrode. The second pad may include substantially the same material as the second electrode.

In an embodiment, the first pad may include a transparent conductive oxide. The second pad may include a metal.

In an embodiment, the reflective unit may further include an insulation layer disposed between the second pad and the sealing unit, the insulation layer covering the second pad.

In an embodiment, at least one opening may be formed in the second pad, the at least one opening overlapping the sealing unit.

In an embodiment, the sealing unit may include a fit.

A display device according to some embodiments may include the following elements: a substrate; a display unit disposed on the substrate; an encapsulation substrate facing the substrate; and a reflective unit disposed on the encapsulation substrate to face the display unit. The reflective unit may include a transflective electrode which may reflect some rays of external light incident through the encapsulation substrate and transmit other rays of the external light; and an electrochromic layer which may have light transmittance for the external light controlled by an electric field. The transflective electrode may be one of electrodes used for forming the electric field.

A embodiment may be related to a display device. The display device may include the following elements: a first substrate; an encapsulation substrate overlapping the first substrate; a display unit between the first substrate and the encapsulation substrate; a first electrode disposed between the display unit and the encapsulation substrate and having a first reflectance; a second electrode overlapping the first electrode and having a second reflectance greater than the first reflectance; and an electrochromic unit disposed between the first electrode and the second electrode.

The first electrode may include and/or may be formed of a transparent conductive oxide.

The second electrode may include a metal.

A thickness of the second electrode may be in a range from 40 angstrom (Å) to 500 Å.

The first electrode may transmit an external light incident through the encapsulation substrate. The second electrode may reflect some rays of the external light and may transmit other rays of the external light.

The display device may include a transparent protective electrode directly contacting the second electrode.

The transparent protective electrode may include and/or may be formed of a transparent conductive oxide.

A thickness of the transparent conductive oxide may be in a range from 10 Å to 1000 Å.

The electrochromic unit may include an electrochromic material and an electrolyte.

The electrochromic unit may include an electrolyte layer and an electrochromic layer directly contacting the electrolyte layer.

The display device may include a sealing unit disposed between the first substrate and the encapsulation substrate, directly contacting each of the encapsulation substrate and the first substrate, and being spaced from at least one of the display unit and the electrochromic unit.

The display device may include the following elements: a first pad disposed between a first portion of the sealing unit and the encapsulation substrate and electrically connected to the first electrode; and a second pad disposed between a second portion of the sealing unit and the encapsulation substrate, spaced from the first pad, and electrically connected to the second electrode.

Each of a material of the first pad and a material of the second pad may be identical to a material of the first electrode.

At least one of the first pad and the second pad may include and/or may be formed of a transparent conductive oxide.

A material of the first pad may be identical to a material of the first electrode. A material of the second pad may be identical to a material of the second electrode.

The first pad may include and/or may be formed of a transparent conductive oxide. The second pad may include and/or may be formed of a metal.

The display device may include an insulation layer disposed between the second pad and the second portion of the sealing unit and covering the second pad.

At least one opening may be formed in the second pad, the at least one opening overlapping (and/or being positioned on) the second portion of the sealing unit.

The sealing unit may include a frit.

An embodiment may be related to a display device. The display device may include the following elements: a first substrate; an encapsulation substrate overlapping the first substrate; a display unit disposed between the first substrate and the encapsulation substrate; a first electrode disposed between the display unit and the encapsulation substrate; a transflective electrode overlapping the first electrode; and an electrochromic layer disposed between the first electrode and the transflective electrode. The transflective electrode and the first electrode may form an electric field for controlling light transmittance of the electrochromic layer.

In a display device according to embodiments, an electrochromic unit may serve as a reflectance control member, and one of the electrodes used for controlling the electrochromic unit may serve as a mirror. Further, one or more of the electrochromic unit and the electrodes may be embedded in the display device. Therefore, the display device may provide a mirror function having controllable reflectance, and the volume/thickness of the display device may be minimized.

DETAILED DESCRIPTION OF EMBODIMENTS

Example embodiments are described with reference to the accompanying drawings. Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Figure 1:
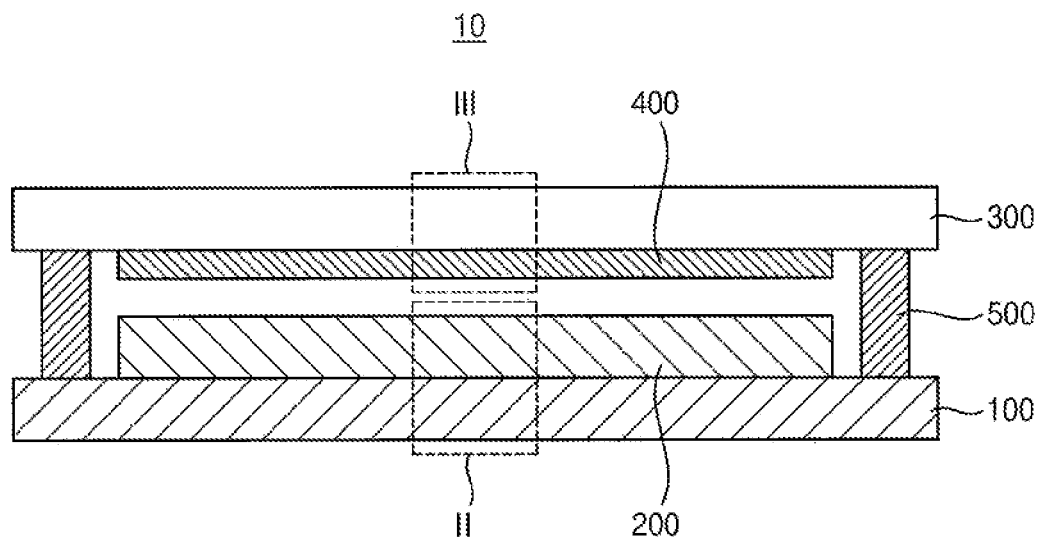
FIG. 1 is a cross-sectional view illustrating a display device according to an embodiment.

FIG. 1 is a cross-sectional view illustrating a display device according to an embodiment.

Referring to FIG. 1, a display device 10 may include a substrate 100, a display portion 200 (or display unit 200), an encapsulation substrate 300, and a reflective portion 400 (or reflective unit 400). In an embodiment, the display device 10 may further include a sealing portion 500 (or sealing unit 500).

The substrate 100 may include or may be made of a glass material. In an embodiment, the substrate 100 may include or may be made of a transparent plastic material. For example, the plastic material may be an insulation organic material such as one of polyethersulfone (PES), polyacrylate (PAR), polyetherimide (PEI), polyethylene napthalate (PEN), polyethylene terephthalate (PET), polyphenylene sulfide (PPS), polyarylate, polyimide, polycarbonate (PC), triacetyl cellulose (TAC), and cellulose acetate propionate (CAP).

Figure 2:
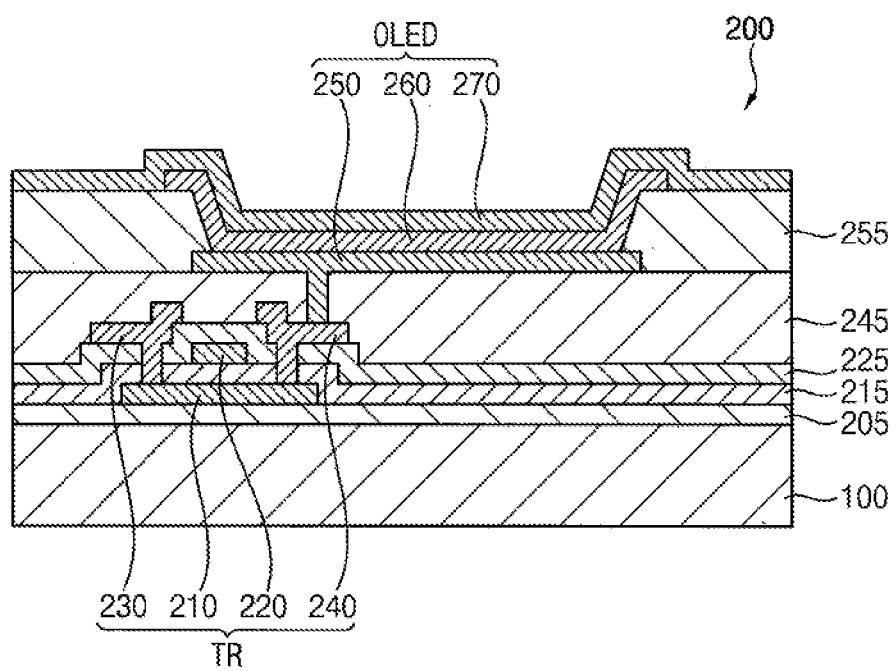
FIG. 2 is a cross-sectional view illustrating a substrate and a display portion (or display unit) of a display device according to an embodiment.

The display portion 200 may be disposed on the substrate 100. For example, the display portion 200 may be disposed on a center portion of a top surface of the substrate 100. The display portion 200 may include a plurality of pixels. The pixels may emit a plurality of lights in a direction to the encapsulation substrate 300 (an upper direction in FIG. 1), and the lights may be combined to display an image. The display portion 200 may include an organic light emitting element, a liquid crystal element, or an alternative display element. FIG. 2 illustrates that the display portion 200 includes an organic light emitting element. In an embodiment, the display portion 200 may include a liquid crystal element.

FIG. 2 is a cross-sectional view illustrating a substrate and a display portion of a display device according to an embodiment. For example, FIG. 2 may be a cross-sectional view enlarging a portion II in FIG. 1, and may illustrate one pixel.

Referring to FIG. 2, the display portion 200 may include a pixel circuit and an organic light emitting element OLED.

A buffer layer 205 may be formed on the substrate 100. The buffer layer 205 may provide a flat surface on the substrate 100. The buffer layer 205 may prevent a permeation of moisture and/or oxygen from outside. In an embodiment, the buffer layer 205 may be unnecessary.

The pixel circuit may be disposed on the buffer layer 205. For example, the pixel circuit may include a plurality of transistors and at least one capacitor. FIG. 2 illustrates one transistor TR. In an embodiment, the transistor TR may be a driving transistor including an active pattern 210, a gate electrode 220, a source electrode 230, and a drain electrode 240. The pixel circuit may transmit a driving current to the organic light emitting element OLED based on a gate signal, a data signal, etc. transmitted from outside.

The active pattern 210 may be formed on the buffer layer 205. The active pattern 210 may be formed of amorphous silicon, polycrystalline silicon, or an oxide semiconductor. The active pattern 210 may include a source region, a drain region, and a channel region positioned between the source region and the drain region.

In an embodiment, the source region and the drain region may be formed by doping impurities on opposite sides of the active pattern 210, which is formed of, e.g., amorphous silicon or polycrystalline silicon. For example, the opposite sides of the active pattern 210 may be doped by one or more elements belonging to Group 3 of the periodic table of elements such as boron (B) to form a p-type semiconductor. In an embodiment, the opposite sides of the active pattern 210 may be doped by one or more elements belonging to Group 5 of the periodic table of elements such as nitrogen (N) to form an n-type semiconductor.

A gate insulation layer 215 may be formed on the buffer layer 205 to cover the active pattern 210. The gate electrode 220 may be formed on the gate insulation layer 215. The gate electrode 220 may overlap the channel region of the active pattern 210. The gate insulation layer 215 may insulate the gate electrode 220 from the active pattern 210. The gate insulation layer 215 may be formed of an inorganic material such as silicon nitride, silicon oxide, or an organic material.

The gate electrode 220 may be formed of a metal such as gold (Au), silver (Ag), copper (Cu), nickel (Ni), platinum (Pt), plumbum (Pb), aluminum (Al), molybdenum (Mo), or an alloy The gate electrode 220 may be formed of various materials in consideration of adhesion, flatness, electric resistance, processability, etc.

An insulation interlayer 225 may be formed on the gate insulation layer 215 to cover the gate electrode 220. The source electrode 230 and the drain electrode 240 may be formed on the insulation interlayer 225. Contact holes may be formed in the insulation interlayer 225 and the gate insulation layer 215. The contact holes may expose the source region and the drain region of the active pattern 210, respectively. The source electrode 230 and the drain electrode 240 may be in contact with the source region and the drain region, respectively. The insulation interlayer 225 may insulate the source/drain electrodes 230 and 240 from the gate electrode 220. The insulation interlayer may be formed of an inorganic material such as silicon nitride, silicon oxide, or an organic material.

The source electrode 230 and the drain electrode 240 may be formed of a metal such as gold (Au), silver (Ag), copper (Cu), nickel (Ni), platinum (Pt), plumbum (Pb), aluminum (Al), molybdenum (Mo), or an alloy. The source electrode 230 and the drain electrode 240 may be formed of various materials in consideration of adhesion, flatness, electric resistance, processability, etc.

FIG. 2 illustrates the top-gate type transistor TR in which the gate electrode 220 is disposed over the active pattern 210. In an embodiment, the transistor TR may include a bottom-gate type transistor in which the gate electrode is disposed under the active pattern.

A passivation layer 245 may be formed on the insulation interlayer 225 to cover the source electrode 230 and the drain electrode 240. The passivation layer 245 may cover the transistor TR, and may have a substantially flat top surface. For example, the passivation layer 245 may be formed of an inorganic insulation material and/or an organic insulation material.

The organic light emitting element OLED may be formed on the passivation layer 245. The organic light emitting element OLED may include a pixel electrode 250, an organic light emitting layer 260, and an opposite electrode 270. The organic light emitting element OLED may emit light based on the driving current transmitted from the pixel circuit.

The pixel electrode 250 may be formed on the passivation layer 245. A via hole may be formed in the passivation layer 245. The via hole may expose the drain electrode 240. The pixel electrode 250 may be in contact with the drain electrode 240 through the via hole. The pixel electrode 250 may be patterned corresponding to each of the pixels. For example, the pixel electrode 250 may be formed of a metal and/or a transparent conductive material.

A pixel defining layer 255 may be formed on the passivation layer 245 to partially cover the pixel electrode 250. The pixel defining layer 255 may cover an edge portion of the pixel electrode 250, and may expose a center portion of the pixel electrode 250. For example, the pixel defining layer 255 may be formed of an inorganic insulation material and/or an organic insulation material.

The organic light emitting layer 260 may be formed on the exposed pixel electrode 250 and the pixel defining layer 255. In an embodiment, the organic light emitting layer 260 may be patterned corresponding to each of the pixels. The organic light emitting layer 260 may emit visible light based on the driving current transmitted from the pixel circuit.

The opposite electrode 270 may be formed on the organic light emitting layer 260 and the pixel defining layer 255. The opposite electrode 270 may face the pixel electrode 250 with respect to the organic light emitting layer 260. The opposite electrode 270 may be commonly formed for the plurality of pixels. For example, the opposite electrode 270 may be formed of a metal.

The pixel electrode 250 and the opposite electrode 270 may correspond to an anode and a cathode of the organic light emitting element OLED. In an embodiment, polarities of the pixel electrode 250 and the opposite electrode 270 may be opposite to each other.

In an embodiment, a hole injection layer (HIL), a hole transport layer (HTL), an electron transport layer (ETL), and an electron injection layer (EIL) may be formed on a top surface or a bottom surface of the organic light emitting layer 260. For example, the HIL and the HTL may be formed between the pixel electrode 250 and the organic light emitting layer 260. Further, the ETL and the EIL may be formed between the organic light emitting layer 260 and the opposite electrode 270. In an embodiment, the HIL, the HTL, the ETL, and the EIL may be commonly formed for the plurality of pixels.

Referring to FIG. 1 again, the encapsulation substrate 300 may be disposed over the substrate 100 to face the substrate 100. The encapsulation substrate 300 may be formed of a glass material, a transparent plastic material, etc. similar to the substrate 100.

The reflective portion 400 may be disposed on the encapsulation substrate 300. The reflective portion 400 may face the display portion 200. For example, the reflective portion 400 may be disposed on a center portion of a bottom surface of the encapsulation substrate 300 and may correspond to the display portion 200. The reflective portion 400 may reflect some rays of external light incident through the encapsulation substrate 300, and may transmit other rays of the external light. The reflective portion 400 may transmit light emitted from the display portion 200.

Figure 3:
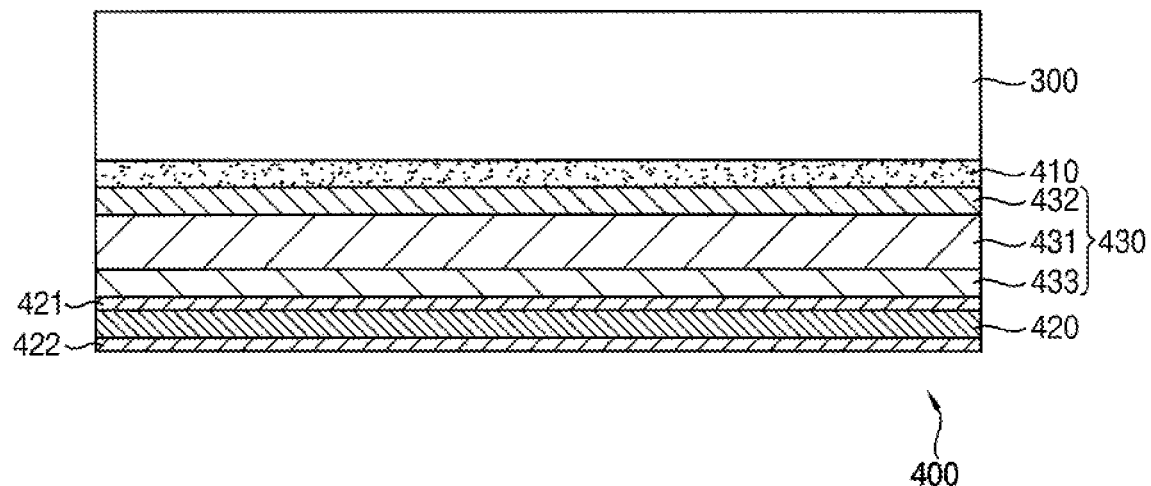
FIG. 3 is a cross-sectional view illustrating an encapsulation substrate and a reflective portion (or reflective unit) of a display device according to an embodiment.

FIG. 3 is a cross-sectional view illustrating an encapsulation substrate and a reflective portion of a display device according to an embodiment. For example, FIG. 3 may be a cross-sectional view enlarging a portion III in FIG. 1.

Referring to FIG. 3, the reflective portion 400 may include a first electrode 410, a second electrode 420, and an electrochromic portion 430 (or electrochromic unit 430).

The first electrode 410 may be disposed on the encapsulation substrate 300. For example, the first electrode 410 may be disposed (directly) on a bottom surface of the encapsulation substrate 300. A first voltage may be applied to the first electrode 410 from a first pad 440 illustrated in FIG. 4 which will be described below.

The first electrode 410 may have a first reflectance which is a relatively low reflectance. In an embodiment, the first electrode 410 may have a relatively high light transmittance.

The first electrode 410 may be a transparent electrode. Thus, the first electrode 410 may transmit the external light incident through the encapsulation substrate 300. Further, the first electrode 410 may transmit light emitted from the display portion 200.

In an embodiment, the first electrode 410 may include or may be made of a transparent conductively oxide. For example, the first electrode 410 may include indium tin oxide (ITO), indium zinc oxide (IZO), or an alternative material.

The second electrode 420 may face/overlap the first electrode 410. For example, the second electrode 420 may be disposed under the first electrode 410 to face the first electrode 410. A second voltage may be applied to the second electrode 420 from a second pad 450 illustrated in FIG. 4 which will be described below. The second voltage may form an electric field with the first voltage. A color of the electrochromic portion 430 may change based on the electric field.

The second electrode 420 may have a second reflectance which is a relatively high reflectance. The second reflectance may be greater than the first reflectance. In an embodiment, the second electrode 420 may have a relatively low light transmittance.

The second electrode 420 may be a transflective electrode. Thus, the second electrode 420 may reflect some rays of external light incident from outside through the encapsulation substrate 300, and may transmit the other rays of the external light. Further, the second electrode 420 may transmit light emitted from the display portion 200. Therefore, the second electrode 420 may serve as a mirror as well as an electrode. Advantageously, the display device 10 may not need an additional mirror for reflecting the external light.

In an embodiment, the second electrode 420 may include or may be made of a metal. For example, the second electrode 420 may include silver (Ag).

In an embodiment, the second electrode 420 may have a thickness in a range between about 40 angstrom (Å) and about 500 Å. When the thickness of the second electrode 420 is less than about 40 Å, the reflectance of the second electrode 420 may not be enough. When the thickness of the second electrode 420 is greater than about 500 Å, the light transmittance of the second electrode 420 may not be enough. Therefore, the second electrode 420 may partially transmit and partially reflect the external light.

The electrochromic portion 430 may be disposed between the first electrode 410 and the second electrode 420. A color of the electrochromic portion 430 may change based on the electric field formed between the first electrode 410 and the second electrode 420. The light transmittance of the electrochromic portion 430 may change depending on the change of the color of the electrochromic portion 430. A reflectance of the second electrode 420, which may serve as a mirror, may be controlled according to the change of the light transmittance of the electrochromic portion 430.

In an embodiment, when an electric field (or a strong electric field) is formed between the first electrode 410 and the second electrode 420, the electrochromic portion 430 may become dark, e.g., become black, thus the light transmittance of the electrochromic portion 430 may decrease. In an embodiment, the strength/portion of the external light transmitted through the electrochromic portion 430 may decrease so that the reflectance of the second electrode 420 (which serves as a mirror) may decrease. In an embodiment, when no electric field (or a weak electric field) is formed between the first electrode 410 and the second electrode 420, the electrochromic portion 430 may become highly transparent, e.g., become colorless, thus the light transmittance of the electrochromic portion 430 may increase. In an embodiment, the strength/portion of the external light transmitted through the electrochromic portion 430 may increase so that the reflectance of the second electrode 420 (which serves as a mirror) may increase.

In an embodiment, the electrochromic portion 430 may become dark when an electric field (or a strong electric field) is formed between the first electrode 410 and the second electrode 420, and the electrochromic portion 430 may become transparent when no electric field (or a weak electric field) is formed between the first electrode 410 and the second electrode 420. In an embodiment, the electrochromic portion 430 may become transparent when an electric field (or a strong electric field) is formed between the first electrode 410 and the second electrode 420, and the electrochromic portion 430 may become dark when no electric field (or a weak electric field) is formed between the first electrode 410 and the second electrode 420.

In an embodiment, the electrochromic portion 430 may include an electrochromic material and an electrolyte. The electrochromic material is a material having an electrochromic characteristic in which light absorptivity is changed by the electrochemical oxidation-reduction reaction. The electrochemical oxidation-reduction phenomenon of the electrochromic material is reversibly generated depending on whether or not a voltage is applied and/or intensity of the voltage, so that light transmittance and light absorbance of the electrochromic material may be reversibly changed.

The electrochromic material may be or may include a metal oxide electrochromic material containing tungsten (W), iridium (Ir), nickel (Ni) and/or vanadium (V), an organic electrochromic material containing viologen and/or quinone, a conductive polymer electrochromic material containing polythiophene, polyaniline and/or polypyrrole, and a derivative. In an embodiment, the electrochromic material may be one of polythiophene, polyaniline, polypyrrole, polyanthracene, polyfluorene, polycarbazole, polyphenylenevinylene, and a derivative of one or more of the above materials. In an embodiment, the electrochromic material may be in a liquid state or a solid state. The electrochromic material may be or may include a $WO_3$ based reductive electrochromic material, a NiO based oxidative electrochromic material, a viologen based electrochromic material, or an alternative material. The electrolyte may be a material providing a moving path of ions for color change of the electrochromic material. The electrolyte may be or may include a material having a solid state, a liquid state, or a gel or sol state.

In an embodiment, the electrochromic portion 430 may include an electrolyte layer 431 and one or more electrochromic layers 432 and/or 433. For example, the electrochromic layers 432 and 433 may be disposed on one surface or opposite surfaces of the electrolyte layer 431. FIG. 3 illustrates that two electrochromic layers 432 and 433 are disposed on the opposite surfaces of the electrolyte layer 431. The electrochromic portion 430 may include one electrochromic layer 432 disposed between the first electrode 410 and the electrolyte layer 431, and/or one electrochromic layer 433 disposed between the second electrode 420 and the electrolyte layer 431. The electrolyte layer 431 may include the aforementioned electrolyte, and the electrochromic layer 432 and 433 may include the aforementioned electrochromic material.

In an embodiment, the reflective portion 400 may further include one or more transparent protective electrodes 421 and/or 422 disposed on the second electrode 420. If the electrochromic layer 433 is directly attached to the second electrode 420 (e.g., a metal electrode), the second electrode 420 may be corroded, or may be damaged by an inverse voltage. In an embodiments, at least one of the transparent protective electrodes 421 and 422 is disposed on the second electrode 420, and corrosion of the second electrode 420 occurred by the inverse voltage generated when a driving voltage of the electrochromic material decreases may be prevented. Thus, the strength of the reflective portion 400 may be improved. In an embodiment, a sheet resistance of the second electrode 420 may decrease by a layered structure including the second electrode 420 and the transparent protective electrode(s) 421 and/or 422. Thus, characteristics of the reflective portion 400 may be improved.

In an embodiment, the transparent protective electrode(s) 421 and/or 422 may be disposed on one surface or opposite surfaces of the second electrode 420. FIG. 3 illustrates that two transparent protective electrodes 421 and 422 are disposed on the opposite surfaces of the second electrode 420. One transparent protective electrode 421 may be disposed between the second electrode 420 and the electrochromic portion 430.

In an embodiment, the transparent protective electrode(s) 421 and/or 422 may include or may be made of a transparent conductive oxide (TCO). For example, the transparent protective electrode(s) 421 and/or 422 may include indium tin oxide (ITO). In an embodiment, a thickness of the transparent protective electrode 421 or 422 may be in a range between about 10 Å and about 1000 Å.

Referring to FIG. 1 again, the sealing portion 500 may include a frit. The frit is a glass material, and may be hardened by a laser exposure. After a laser is irradiated to the frit between the substrate 100 and the encapsulation substrate 300, the substrate 100 and the encapsulation substrate 300 may be secured to each other.

In the display device 10 according to an embodiment, the reflective portion 400 may include the electrochromic portion 430 which serves as a reflectance control member, and one of the electrodes which forms the electric field in the electrochromic portion 430 may be used as a mirror. Further, the reflective portion 400 may be embedded in the display device 10 by being disposed on the encapsulation substrate 300. Therefore, the display device 10 may provide a mirror function having controllable reflectance, and the volume of the display device 10 may decrease.

Figure 4:
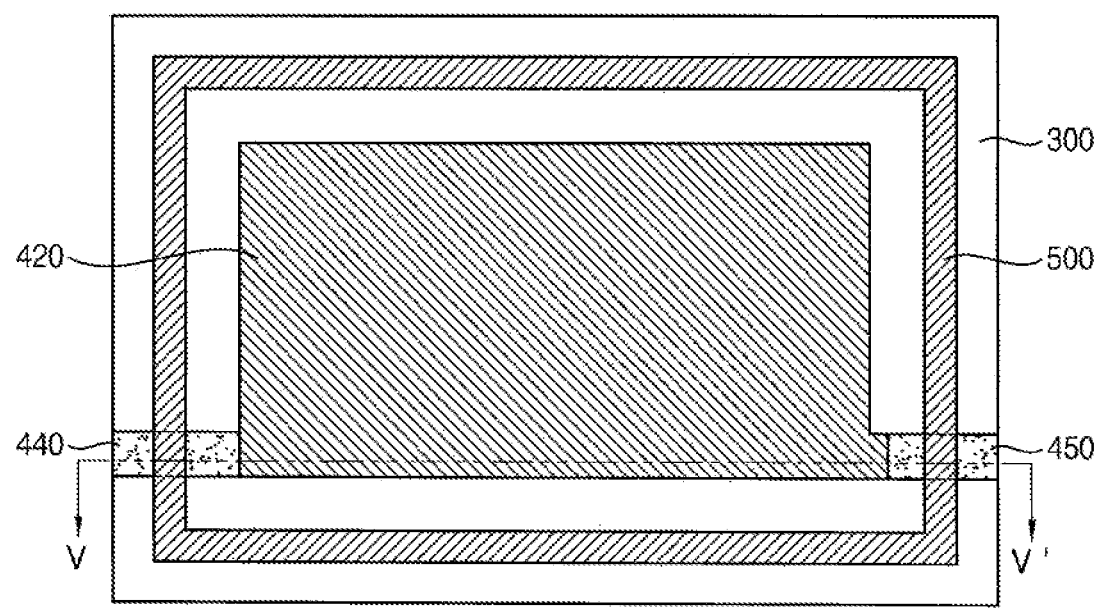
FIG. 4 is a plan view illustrating an encapsulation substrate and a reflective portion (or reflective unit) of a display device according to an embodiment.
Figure 5:
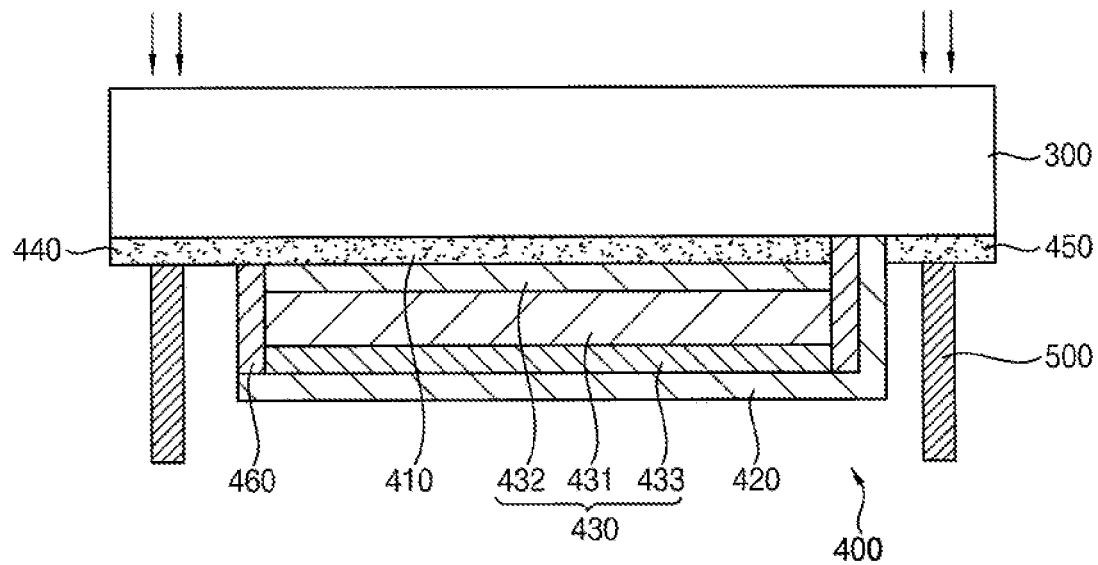
FIG. 5 is a cross-sectional view illustrating an encapsulation substrate and a reflective portion (or reflective unit) of a display device according to an embodiment.

FIG. 4 is a plan view illustrating an encapsulation substrate and a reflective portion of a display device according to an embodiment. FIG. 5 is a cross-sectional view illustrating an encapsulation substrate and a reflective portion of a display device according to an embodiment. FIG. 4 may be a plan view showing a reflective portion viewed from a display portion of a display device according to an embodiment. FIG. 5 may be a cross-sectional view cut along a line V-V' in FIG. 4.

Referring to FIGS. 4 and 5, the reflective portion 400 may include the first electrode 410, the second electrode 420, the electrochromic portion 430, the first pad 440, the second pad 450, and a sidewall 460.

The first electrode 410 may be disposed on the encapsulation substrate 300. The electrochromic portion 430 may be disposed on the first electrode 410. The second electrode 420 may face the first electrode 410 with respect to the electrochromic portion 430. For example, the first electrode 410 may be disposed on a bottom surface of the encapsulation substrate 300, and the second electrode 420 and the electrochromic portion 430 may be disposed under the first electrode 410. The first electrode 410, the second electrode 420, and the electrochromic portion 430 may be disposed at a center portion of the encapsulation substrate 300.

The sidewall 460 may surround a side of the electrochromic portion 430, and may encapsulate the electrochromic material and the electrolyte included in the electrochromic portion 430. Further, the sidewall 460 may include an insulation material, and may insulate the second electrode 420 from the first electrode 410.

The first pad 440 and the second pad 450 may be disposed on the encapsulation substrate 300. For example, the first pad 440 and the second pad 450 may be disposed on a bottom surface of the encapsulation substrate 300, and may be disposed at an edge of the encapsulation substrate 300. The first pad 440 and the second pad 450 may be spaced apart from each other.

FIGS. 4 and 5 illustrate that the first pad 440 and the second pad 450 may be disposed on opposite sides with respect to the first electrode 410. In an embodiment, the first pad 440 and the second pad 450 may be disposed on the same side with respect to the first electrode 410.

The first pad 440 may be electrically connected to the first electrode 410. The first pad 440 may transmit the first voltage to the first electrode 410. The second pad 450 may be electrically connected to the second electrode 420. The second pad 450 may transmit the second voltage to the second electrode 420. The first voltage and the second voltage may form an electric field for controlling light transmittance of the electrochromic portion 430.

The sealing portion 500 may be disposed between the substrate 100 and the encapsulation substrate 300, and may surround the reflective portion 400. In an embodiment, the sealing portion 500 may cover a portion of the first pad 440 and a portion of the second pad 450. In an embodiment, the portion of the first pad 440 and the portion of the second pad 450 may be disposed between the encapsulation substrate 300 and the sealing portion 500.

To harden the sealing portion 500 which is formed of the frit, a laser may be irradiated on a region on which the sealing portion 500 is formed from top of the encapsulation substrate 300 to the sealing portion 500 as illustrated in FIG. 5. In an embodiment, if the first pad 440 and/or the second pad 450, which are disposed between the encapsulation substrate 300 and the sealing portion 500, include a metal having a relatively high reflectance, the laser may be reflected by the metal, or the metal may have a relatively low melting point and may be melted by the laser.

To prevent undesirable reflection and/or melting, in an embodiment, the first pad 440 and the second pad 450 may include a transparent conductive oxide (TCO). For example, the first pad 440 and the second pad 450 may include indium tin oxide (ITO), indium zinc oxide (IZO), or an alternative material. A reflectance of the transparent conductive oxide may be less than that of the metal so that the transparent conductive oxide may transmit the laser. In an embodiment, a melting point of the transparent conductive oxide may be greater than that of the metal so that the transparent conductive oxide may not be undesirably melted.

In an embodiment, the first pad 440 and the second pad 450 may include substantially the same material as the first electrode 410. For example, a transparent conductive oxide layer may be deposited on the encapsulation substrate 300, and the transparent conductive oxide layer may be patterned, so that the first electrode 410, the first pad 440, and the second pad 450 may be substantially simultaneously formed. In an embodiment, the first electrode 410 and the first pad 440 may be integrally formed. After the electrochromic portion 430 and the sidewall 460 are formed, the second electrode 420 may be formed to be in contact with the second pad 450. Thus, the second electrode 420 may be electrically connected to the second pad 450.

Figure 6:
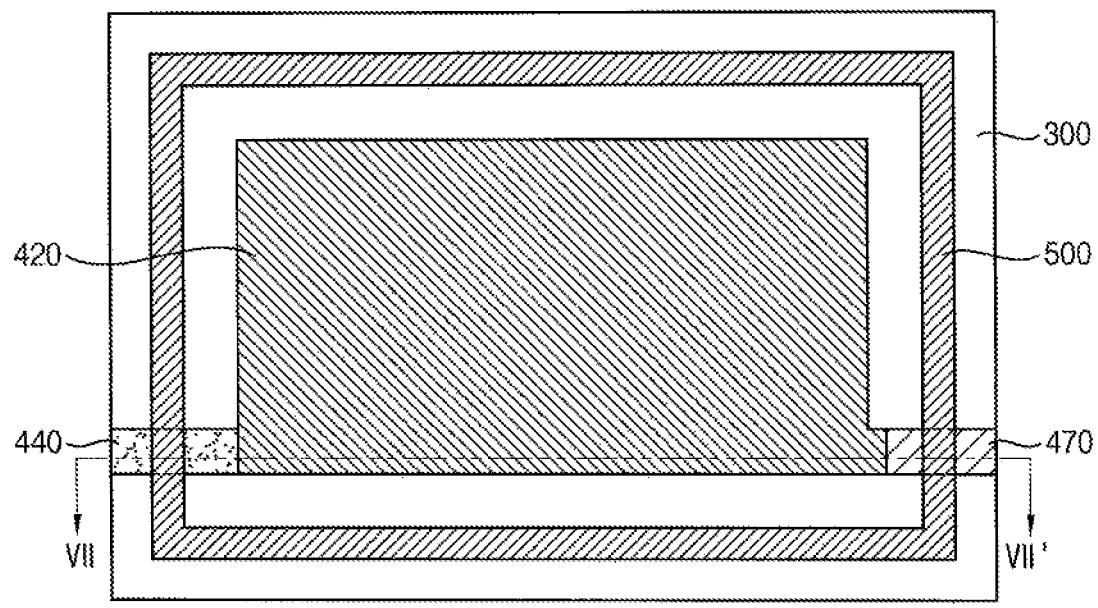
FIG. 6 is a plan view illustrating an encapsulation substrate and a reflective portion (or reflective unit) of a display device according to an embodiment.
Figure 7:
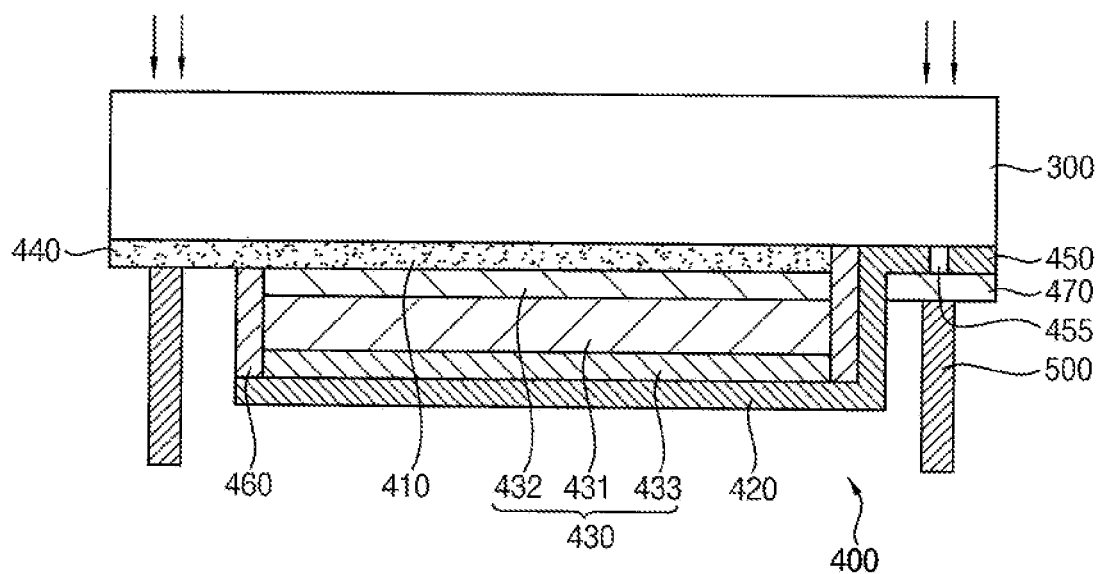
FIG. 7 is a cross-sectional view illustrating an encapsulation substrate and a reflective portion (or reflective unit) of a display device according to an embodiment.

FIG. 6 is a plan view illustrating an encapsulation substrate and a reflective portion of a display device according to an embodiment. FIG. 7 is a cross-sectional view illustrating an encapsulation substrate and a reflective portion of a display device according to an embodiment. FIG. 6 may be a plan view showing a reflective portion viewed from a display portion of a display device according to an embodiment. FIG. 7 may be a cross-sectional view cut along a line VII-VII' in FIG. 6.

Referring to FIGS. 6 and 7, the reflective portion 400 may include the first electrode 410, the second electrode 420, the electrochromic portion 430, the first pad 440, the second pad 450, the sidewall 460, and an insulation layer 470.

The first electrode 410 may be disposed on the encapsulation substrate 300. The electrochromic portion 430 may be disposed on the first electrode 410. The second electrode 420 may face the first electrode 410 with respect to the electrochromic portion 430. For example, the first electrode 410 may be disposed on a bottom surface of the encapsulation substrate 300, and the second electrode 420 and the electrochromic portion 430 may be disposed under the first electrode 410. The first electrode 410, the second electrode 420, and the electrochromic portion 430 may be disposed at a center portion of the encapsulation substrate 300.

The sidewall 460 may surround a side of the electrochromic portion 430, and may encapsulate the electrochromic material and the electrolyte included in the electrochromic portion 430. In an embodiment, the sidewall 460 may include an insulation material, and may insulate the second electrode 420 from the first electrode 410.

The first pad 440 and the second pad 450 may be disposed on the encapsulation substrate 300. For example, the first pad 440 and the second pad 450 may be disposed on a bottom surface of the encapsulation substrate 300, and may be disposed at an edge of the encapsulation substrate 300. The first pad 440 and the second pad 450 may be spaced apart from each other.

FIGS. 6 and 7 illustrate that the first pad 440 and the second pad 450 may be disposed on opposite sides with respect to the first electrode 410 such that the first electrode 410 may be positioned between the pads 440 and 450. In an embodiment, the first pad 440 and the second pad 450 may be disposed on the same side with respect to the first electrode 410 such that one of the pads 440 and 450 may be positioned between the first electrode 410 and the other one of the pads 440 and 450.

The first pad 440 may be electrically connected to the first electrode 410. The first pad 440 may transmit the first voltage to the first electrode 410. The second pad 450 may be electrically connected to the second electrode 420. The second pad 450 may transmit the second voltage to the second electrode 420. The first voltage and the second voltage may form an electric field for controlling light transmittance of the electrochromic portion 430.

The sealing portion 500 may be disposed between the substrate 100 and the encapsulation substrate 300, and may surround the reflective portion 400. In an embodiment, the sealing portion 500 may cover a portion of the first pad 440 and a portion of the second pad 450. In other words, the portion of the first pad 440 and the portion of the second pad 450 may be disposed between the encapsulation substrate 300 and the sealing portion 500.

To harden the sealing portion 500 which is formed of the frit, a laser may be irradiated on a region on which the sealing portion 500 is formed from top of the encapsulation substrate 300 to the sealing portion 500 as illustrated in FIG. 7. In an embodiment, if the first pad 440 and/or the second pad 450, which are disposed between the encapsulation substrate 300 and the sealing portion 500, include a metal having a relatively high reflectance, the laser may be reflected by the metal, or the metal may have a relatively low melting point and may be melted by the laser. If the metal is melted, the reliability of the reflective portion 400 may be affected.

To prevent undesirable reflection and/or melting, in an embodiment, the first pad 440 may include a transparent conductive oxide (TCO). Further, the second pad 450 may include a metal, and the insulation layer 470 may be formed between the second pad 450 and the sealing portion 500. For example, the first pad 440 may include indium tin oxide (ITO), indium zinc oxide (IZO), or an alternative material. Further, the second pad 450 may include silver (Ag), and the insulation layer 470 may include silicon nitride, silicon oxide, or an alternative material. A reflectance of the transparent conductive oxide may be less than that of the metal so that the transparent conductive oxide may transmit the laser. In an embodiment, a melting point of the transparent conductive oxide may be greater than that of the metal so that the transparent conductive oxide may not be easily melted. In an embodiment, although the second pad 450 is formed of metal, the insulation layer 470 may cover the second pad 450 so that melted metal may not move, and the melted metal may be solidified after the irradiation of the laser; therefore, the reliability of the reflective portion 400 may be maintained.

In an embodiment, at least one opening 455 (e.g., a through hole or a transparent portion) may be formed in the second pad 450. The opening 455 may overlap (and/or may be positioned on/over) the sealing portion 500. For example, a plurality of openings 455 may be formed in the second pad 450. When a laser is irradiated from top of the encapsulation substrate 300 to the sealing portion 500, the laser may be transferred/transmitted to the sealing portion 500 through the opening 455, so that the sealing portion 500 may be hardened by the laser.

In an embodiment, the first pad 440 may include substantially the same material as the first electrode 410, and the second pad 450 may include substantially the same material as the second electrode 420. For example, a transparent conductive oxide layer may be deposited (directly) on the encapsulation substrate 300, and the transparent conductive oxide layer may be patterned, so that the first electrode 410 and the first pad 440 may be substantially simultaneously formed. In an embodiment, the first electrode 410 and the first pad 440 may be integrally formed. After the electrochromic portion 430 and the sidewall 460 are formed, a metal layer may be deposited on the electrochromic portion 430, the sidewall 460, and the encapsulation substrate 300, and the metal layer may be patterned, so that the second electrode 420 and the second pad 450 may be substantially simultaneously formed. In an embodiment, the second electrode 420 and the second pad 450 may be integrally formed. Then, the insulation layer 470 may be formed to cover the second pad 450.

FIGS. 6 and 7 illustrate that the insulation layer 470 covers only the second pad 450. In an embodiment, the insulation layer 470 may cover the second electrode 420 as well as the second pad 450. In an embodiment, the insulation layer 470 may not be patterned, and may substantially completely cover a face of the encapsulation substrate 300.

The display device according to embodiments may be included in a computer, a notebook, a mobile phone, a smartphone, a smart pad, a PMP, a PDA, an MP3 player, or a different electronic device.

Although embodiments have been described with reference to the drawings as examples, the described embodiment may be modified and changed without departing from the technical spirit defined in the following claims.

What is claimed is:

1. A display device, comprising:
   a first substrate having a first face and a second face opposite the first face in a first direction;
   an encapsulation substrate overlapping the first substrate and facing the first face of the first substrate;
   a display unit disposed between the first face of the first substrate and the encapsulation substrate in the first direction and comprising a plurality of pixels;
   a first electrode disposed between the display unit and the encapsulation substrate and having a first reflectance;
   a second electrode overlapping the first electrode and having a second reflectance greater than the first reflectance;
   an electrochromic unit disposed between the first electrode and the second electrode; and
   a sealing unit disposed between the first substrate and the encapsulation substrate, overlapping the encapsulation substrate, and sealing the display unit and the electrochromic unit together with the first substrate and the encapsulation substrate,
   wherein two sections of the sealing unit are opposite each other in a second direction,
   wherein the second direction is perpendicular to the first direction, and
   wherein the electrochromic unit is positioned between the two sections of the sealing unit in the second direction and is spaced from each of the two sections of the sealing unit.

2. The display device of claim 1, wherein the first electrode comprises a transparent conductive oxide.

3. The display device of claim 1, wherein the second electrode comprises a metal.

4. The display device of claim 3, wherein a thickness of the second electrode is in a range from 40 angstrom (Å) to 500 Å.

5. The display device of claim 1, wherein the first electrode transmits an external light incident through the encapsulation substrate,
   wherein the second electrode reflects some rays of the external light and transmits other rays of the external light.

6. The display device of claim 1, comprising: a transparent protective electrode directly contacting the second electrode.

7. The display device of claim 6, wherein the transparent protective electrode comprises a transparent conductive oxide.

8. The display device of claim 6, wherein a thickness of the transparent conductive oxide is in a range from 10 Å to 1000 Å.

9. The display device of claim 1, wherein the electrochromic unit comprises an electrochromic material and an electrolyte.

10. The display device of claim 1, wherein the electrochromic unit comprises an electrolyte layer and an electrochromic layer directly contacting the electrolyte layer.

11. The display device of claim 1, wherein each of the two sections of the sealing unit is spaced from at least one of the first electrode and the second electrode.

12. The display device of claim 11, comprising:
   a first pad disposed between a first portion of the sealing unit and the encapsulation substrate and electrically connected to the first electrode; and
   a second pad disposed between a second portion of the sealing unit and the encapsulation substrate, spaced from the first pad, and electrically connected to the second electrode.

13. The display device of claim 12, wherein each of a material of the first pad and a material of the second pad is identical to a material of the first electrode.

14. The display device of claim 12, wherein at least one of the first pad and the second pad comprises a transparent conductive oxide.

15. The display device of claim 12, wherein a material of the first pad is identical to a material of the first electrode, and
   wherein a material of the second pad is identical to a material of the second electrode.

16. The display device of claim 12, wherein the first pad comprises a transparent conductive oxide, and
   wherein the second pad comprises a metal.

17. The display device of claim 16, comprising: an insulation layer disposed between the second pad and the second portion of the sealing unit and covering the second pad.

18. The display device of claim 16, wherein at least one opening is formed in the second pad, the at least one opening overlapping the sealing unit.

19. The display device of claim 11, wherein the sealing unit comprises a frit.

20. A display device, comprising:
- a first substrate having a first face and a second face opposite the first face in a first direction;
- an encapsulation substrate overlapping the first substrate and facing the first face of the first substrate;
- a display unit disposed between the first face of the first substrate and the encapsulation substrate in the first direction and comprising a plurality of pixels;
- a first electrode disposed between the display unit and the encapsulation substrate;
- a transflective electrode overlapping the first electrode;
- an electrochromic layer disposed between the first electrode and the transflective electrode; and
- a sealing unit disposed between the first substrate and the encapsulation substrate, overlapping the encapsulation substrate, and sealing the display unit and the electrochromic layer together with the first substrate and the encapsulation substrate,
- wherein two sections of the sealing unit are opposite each other in a second direction,
- wherein the second direction is perpendicular to the first direction,
- wherein the electrochromic layer is positioned between the two sections of the sealing unit in the second direction and is spaced from each of the two sections of the sealing unit, and
- wherein the transflective electrode and the first electrode are configured to form an electric field for controlling light transmittance of the electrochromic layer.

* * * * *